US011340665B2

(12) United States Patent
Chang et al.

(10) Patent No.: US 11,340,665 B2
(45) Date of Patent: May 24, 2022

(54) TIERED LOCKING MECHANISM FOR SECURING COMPONENT CARDS TO DIFFERENT HEIGHT CONNECTORS FOR A MAIN BOARD

(71) Applicant: QUANTA COMPUTER INC., Taoyuan (TW)

(72) Inventors: Chun Chang, Taoyuan (TW); Hsin-Chieh Lin, Taoyuan (TW); Chia-Jung Tsai, Taoyuan (TW); Cheng-Chieh Weng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/107,521

(22) Filed: Nov. 30, 2020

(65) Prior Publication Data
US 2022/0066519 A1 Mar. 3, 2022

Related U.S. Application Data

(60) Provisional application No. 63/074,246, filed on Sep. 3, 2020.

(51) Int. Cl.
*H05K 7/14* (2006.01)
*G06F 1/18* (2006.01)
*H01R 13/629* (2006.01)

(52) U.S. Cl.
CPC .............. *G06F 1/186* (2013.01); *G06F 1/185* (2013.01); *H01R 13/629* (2013.01); *H05K 7/1402* (2013.01)

(58) Field of Classification Search
USPC ...... 361/796, 759, 801–803, 679.08; 439/65, 439/66, 74, 75
See application file for complete search history.

(56) References Cited

U.S. PATENT DOCUMENTS

| 9,564,712 | B1 * | 2/2017 | Shih | G06F 1/185 |
| 9,778,708 | B1 * | 10/2017 | Meserth | G06F 1/185 |
| 10,299,397 | B1 * | 5/2019 | Chen | H05K 5/0221 |
| 2016/0249455 | A1 * | 8/2016 | Yang | F16B 5/0642 |
| 2017/0371383 | A1 * | 12/2017 | Yang | F16B 33/002 |

* cited by examiner

*Primary Examiner* — Hung S. Bui
(74) *Attorney, Agent, or Firm* — Nixon Peabody LLP

(57) ABSTRACT

A tiered locking mechanism secures a component card to a printed circuit board and includes a base, a top slider structure, and a biasing element. The base includes a first-tier side wall and a coupling structure configured to engage the PCB. The top slider structure includes a second-tier side wall along with protrusions having a beveled edge. The top slider structure is slidable between locked and unlocked positions. The unlocked position includes the protrusions being displaced away from a component card engagement side relative to the locked position. A bottom one of the protrusions and the first-tier side wall form a first receiving slot in the locked position. Atop one of the plurality of protrusions and the second-tier wall form a second receiving slot. The biasing element is configured to urge the top slider structure toward the locked position and to compress as the top slider structure moves away from the component card engagement side.

20 Claims, 7 Drawing Sheets

TIERED LOCKING MECHANISM FOR SECURING COMPONENT CARDS TO DIFFERENT HEIGHT CONNECTORS FOR A MAIN BOARD

CROSS-REFERENCE TO RELATED APPLICATION

This application claims priority under 35 U.S.C. § 119 to U.S. Provisional Application No. 63/074,246, entitled "AN ADJUSTABLE PCB LOCK LATCH FOR MULTI HEIGHT M.2 MODULE", filed on Sep. 3, 2020. The contents of that application are hereby incorporated by reference in their entirety.

FIELD OF THE INVENTION

The present disclosure generally relates to a tiered lock mechanism. More specifically, the present disclosure relates to a tiered locking mechanism for securing a component card to connectors of different heights for a main printed circuit board ("PCB") of a computing device.

BACKGROUND

Component cards, such as M.2 cards, are configured to be coupled to a main PCB and are often installed, released, replaced, and/or otherwise uncoupled from the main PCB for any number of reasons, such as maintenance. Component cards, such as M.2 cards, are typically docked to a main PCB by a single-height connector. Existing mechanisms that secure component cards to a main PCB require a user to engage and/or disengage one or more coupling mechanisms to secure the component card to the main PCB. Users may often have a need to add or replace a component card to the main PCB. There is a need for more versatile lock mechanisms for computing devices that provide for the securing of different component cards, such as M.2 cards, in different configurations.

SUMMARY

According to one embodiment, a tiered locking mechanism is configured to secure a component card to a printed circuit board (PCB). The tiered locking mechanism includes a base, a top slider structure, and a biasing element. The base includes a first-tier side wall at a component card engagement side of the tiered locking mechanism and a coupling structure configured to engage the PCB. The top slider structure is coupled to and disposed above the base. The top slider structure includes a second-tier side wall at the component card engagement side and a plurality of protrusions each having a beveled edge. The top slider structure is slidable between a locked position and an unlocked position. The unlocked position includes the plurality of protrusions being displaced away from the component card engagement side relative to the locked position. A bottom one of the plurality of protrusions and the first-tier side wall form a first receiving slot in the locked position. A top one of the plurality of protrusions and the second-tier wall form a second receiving slot. The biasing element is disposed between the base and the top slider structure. The biasing element is configured to urge the top slider structure toward the locked position and to compress as the top slider structure is displaced away from the component card engagement side to an unlocked position.

In a further aspect of the embodiment, the locking mechanism includes a ribbed portion of a top surface of the top slider structure opposite the plurality of protrusions. The ribbed portion is configured to assist moving the top slider structure from the locked position to the unlocked position. In some embodiments, the coupling structure includes at least one securing element configured to be disposed through an aperture formed in the PCB. In some embodiments, the coupling structure includes a threaded aperture, and the at least one securing element is a screw coupled to the threaded aperture. In some embodiments, the coupling structure is configured to form a pressure fit within the aperture.

In a further aspect of the embodiment, the biasing element is a coiled spring. In some embodiments, the top slider structure includes a spring guide with the spring disposed about the spring guide. The base includes a biasing element receiving portion with the spring and spring guide disposed therein. In some embodiments, the spring is coupled to the base and the top slider structure. In some embodiments, an aperture is formed in an end of the base opposite the component card engagement side. In some embodiments, the aperture is configured to allow at least a portion of the spring guide to pass through.

In a further aspect of the embodiment, the component card is an M.2 card having a notch configured to be received in the first receiving slot when coupled to a short connector to the PCB, and in the second receiving slot when coupled to a tall connector to the PCB. In some embodiments, the notch is a substantially semicircular. In some embodiments, the notch engages with the beveled edge of the top one of the plurality of protrusions before being seated in the second receiving slot. The top slider structure is configured to initially be displaced away from the component card engaging end, followed by being displaced toward the component card engaging end to the locked position. In some embodiments, the notch engages with the beveled edge of the bottom one of the plurality of protrusions before being seated in the first receiving slot. The bottom slider structure is configured to initially be displaced away from the component card engaging end, followed by being displaced toward the component card engaging end to the locked position.

According to another embodiment, a component board includes a printed circuit board, and at least one tiered locking mechanism is configured to secure a component card to the printed circuit board. The at least one tiered locking mechanism includes a base, a top slider, and a biasing element. The base includes a first-tier side wall at a component card engagement side of the at least one tiered locking mechanism and a coupling structure configured to engage the printed circuit board. The top slider structure is coupled to and disposed above the base. The top slider structure includes a second-tier side wall at the component card engagement side and a plurality of protrusions each having a beveled edge. The top slider structure is slidable between a locked position and an unlocked position. The unlocked position includes the plurality of protrusions being displaced away from the component card engagement side relative to the locked position. A bottom one of the plurality of protrusions and the first-tier side wall form a first receiving slot in the locked position. A top one of the plurality of protrusions and the second-tier wall form a second receiving slot. The biasing element is disposed between the base and the top slider structure. The biasing element is configured to urge the top slider structure toward the locked position and to compress as the top slider structure is displaced away from the component card engagement side to an unlocked position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

Figure 1A:
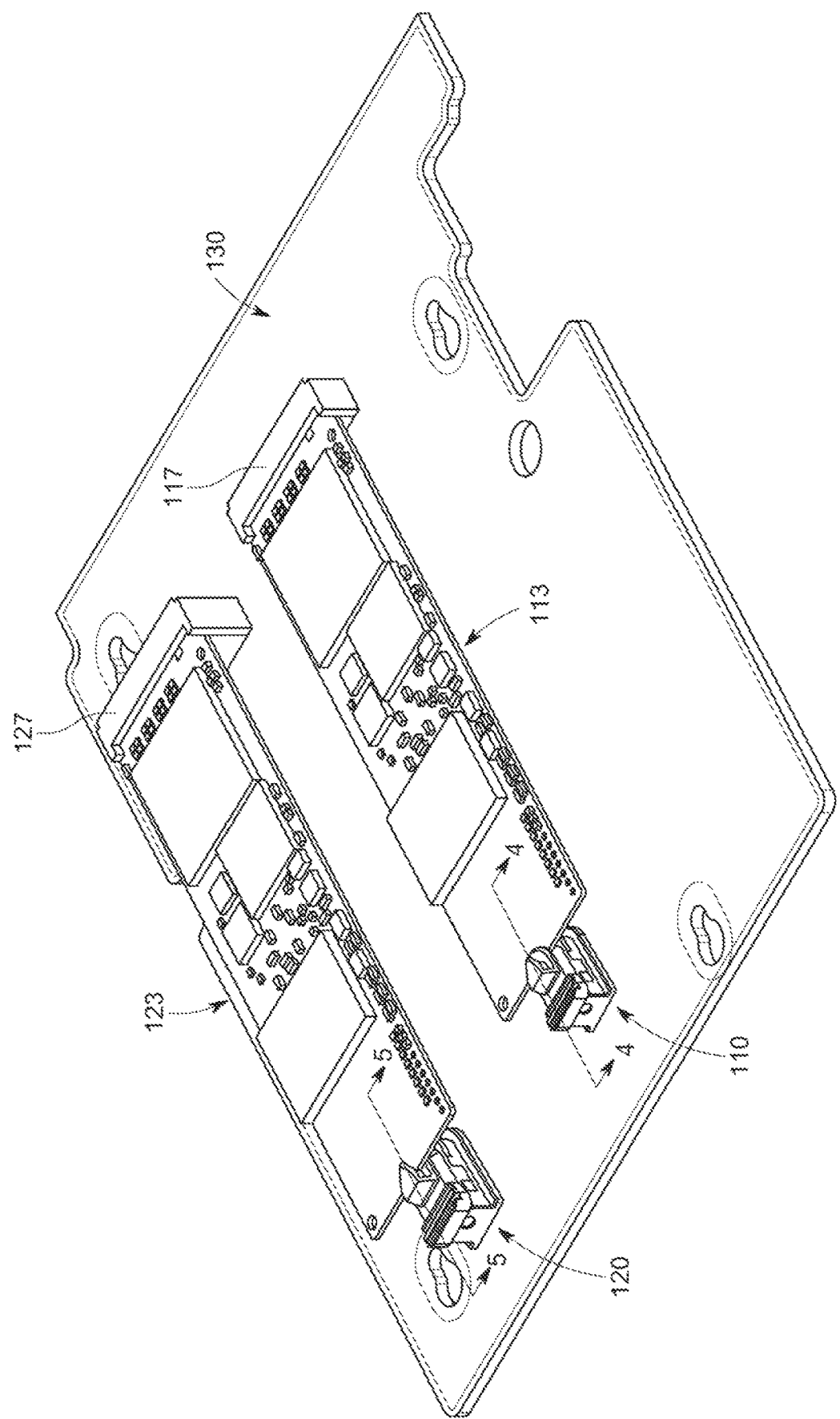
FIGS. 1A and 1B depict a right isometric view and a top view of exemplary tiered locking mechanisms for securing a high-position component card to a tall connector, and a low-position component cards to a short connector, for a printed circuit board ("PCB") of a computing device, according to some implementations of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at,", "near" or "nearly at," or "within 3-5% of," or "within acceptable manufacturing tolerances," or any logical combination thereof, for example.

With regards to the present disclosure, the terms "computing device" or "computer device" refer to any electronically-powered or battery-powered equipment that has hardware, software, and/or firmware components, where the software and/or firmware components can be configured, for operating features on the device. The term "coupled" means connected, whether directly or indirectly through intervening components, and is not necessarily limited to physical connections. The connection can be such that the objects are permanently connected or releasably connected. The term "substantially" is defined to be essentially conforming to the particular dimension, shape, or other word that substantially modifies, such that the component need not be exact. For example, substantially cylindrical means that the object resembles a cylinder, but can have one or more deviations from a true cylinder.

The present technology relates to a component board having a printed circuit board and at least one tiered locking mechanism configured to secure a component card to the printed circuit board (PCB). The present technology also relates to a tiered locking mechanism for securing a component card to a PCB. The present technology provides versatile tiered locking mechanisms for computing devices that provide for the securing of different component cards at different height configurations using the same tiered locking mechanism despite the differing component card installation heights.

In some implementations, the tiered locking mechanism includes a base, a top slider, and a biasing element. The base can include a first-tier side wall at a component card engagement side of the tiered locking mechanism and a coupling structure configured to engage the PCB. The top slider structure can be coupled to and disposed above the base. The top slider structure may include a second-tier side wall at the component card engagement side and protrusions each having a beveled edge. The top slider structure can be slidable between a locked position and an unlocked position. The unlocked position includes the plurality of protrusions being displaced away from the component card engagement side relative to the locked position. A bottom one of the protrusions and the first-tier side wall can form a first receiving slot in the locked position. A top one of the protrusions and the second-tier wall can form a second receiving slot. The biasing element is disposed between the base and the top slider structure. The biasing element urges the top slider structure toward the locked position and compresses as the top slider structure is displaced away from the component card engagement side to an unlocked position.

Figure 1B:
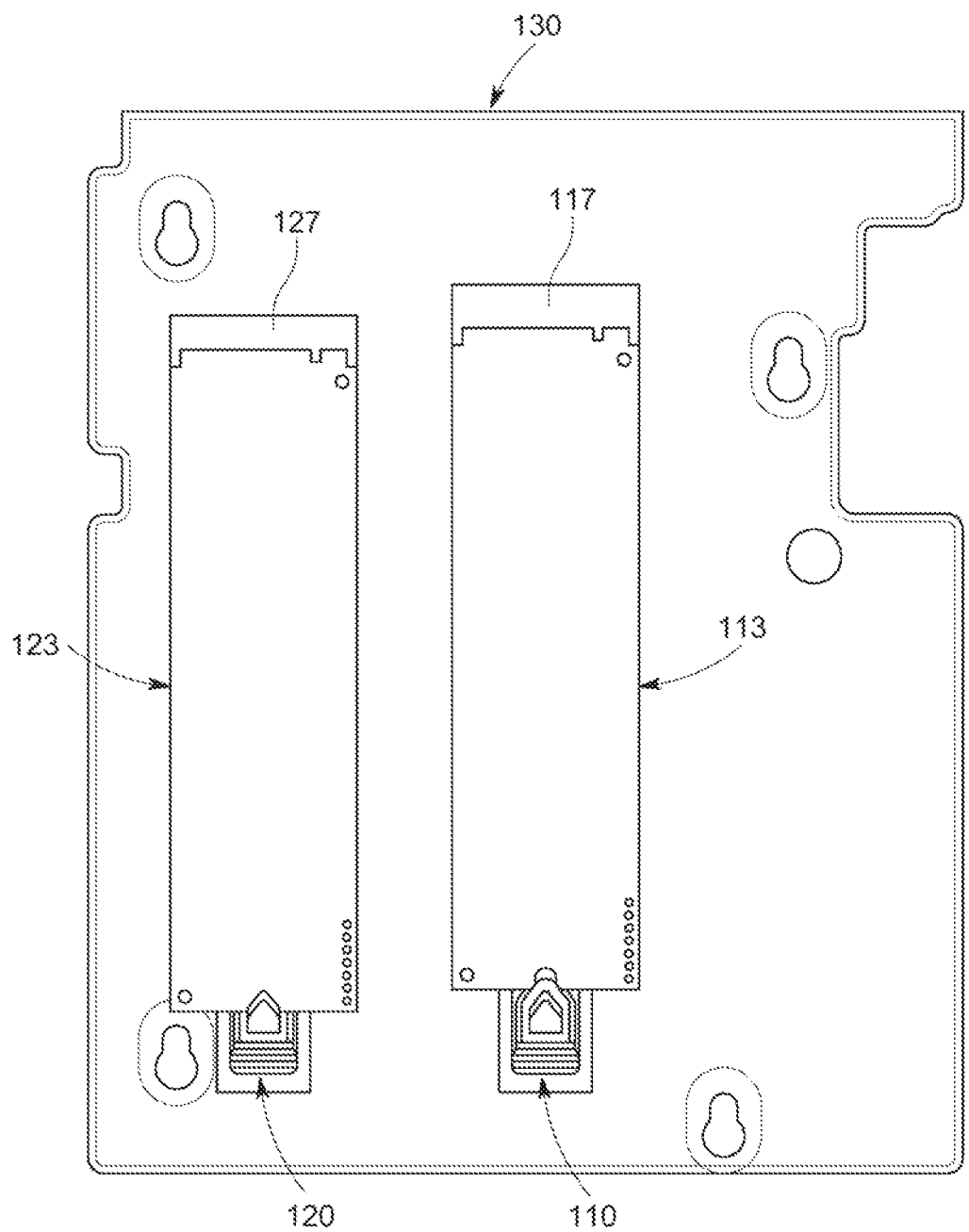

Turning now to FIGS. 1A and 1B, right isometric and top views are depicted of exemplary tiered locking mechanisms 110, 120. Tiered locking mechanism 110 secures a low-position component card 113 to a PCB 130 for a computing device using a short connector 117. Tiered locking mechanism 120 secures a high-position component card 123 to the PCB 130 using a tall connector 127. The primary difference between tiered locking mechanisms 110, 120 is that the installation height of the respective component cards 113, 123 that the locking mechanisms 110, 120 secure are different. In addition, the location where the component cards 113, 123 are secured on the respective tiered locking mechanisms 110, 120 is different, too. Otherwise, the tiered locking mechanisms 110, 120 are interchangeable and can be used for both low-position and high-position component card configurations because both tiered locking mechanisms include a unique combination of features to accommodate different component card installation heights.

The tiered locking mechanisms 110, 120 can have applications for securing different types of components cards to a main board of a computing device, such an M.2 solid-state drive or other internally mounted computer expansion cards for a computing device. Other types of component cards are also contemplated.

Figure 1C:
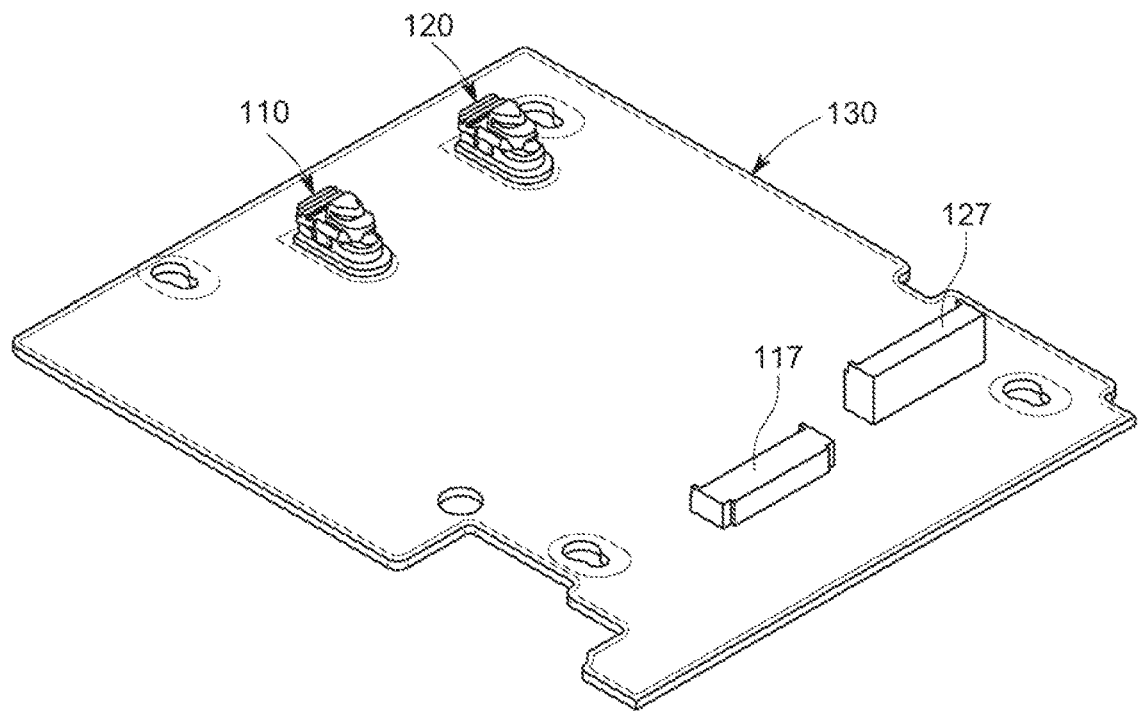
FIG. 1C depicts a left isometric view of the tiered locking mechanisms, the tall connector, and the low connector from FIGS. 1A and 1B, according to some implementations of the present disclosure.

Referring to FIG. 1C, a left isometric view is depicted of the tiered locking mechanisms 110, 120, the tall connector 127 for the high-position component card, and the short connector 117 for the low-position component card, except FIG. 1C does not depict the respective component cards 113, 123 previously illustrated in FIGS. 1A and 1B. The component cards (not shown) are supported at one end by one of the tiered lock mechanisms 110, 120, and at the opposite end by the corresponding short or tall connectors 117, 127 that provide connection to the PCB 130. The component cards 113, 123 depicted in FIGS. 1A and 1B when installed am suspended at different heights above the PCB 130.

Figure 2:
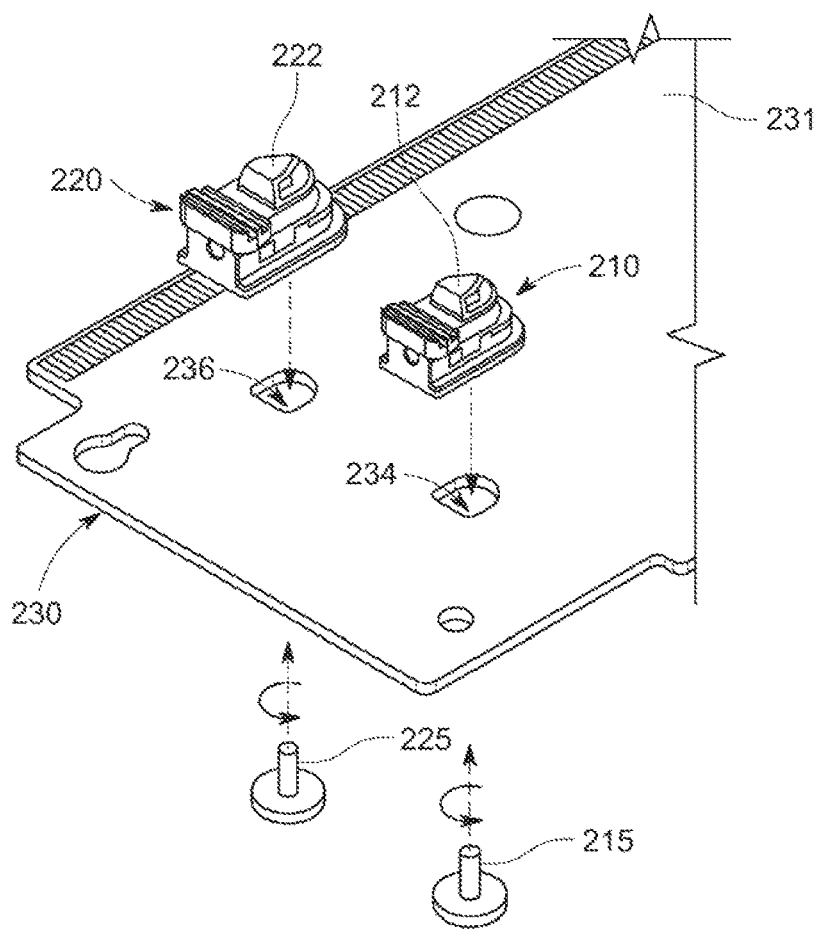
FIG. 2 depicts an exploded right isometric view of exemplary tiered locking mechanisms being secured to a PCB, according to some implementations of the present disclosure.

Turning to FIG. 2, an exploded right isometric view is depicted of exemplary tiered locking mechanisms 210, 220 that are secured to a partially depicted PCB 230 for a computing device. The tiered locking mechanisms 210, 220 each include respective top slider structures 212, 222 that can be moved between a locked position and an unlocked position to allow a component card to be secured to or removed from connectors to the PCB 230. The tiered locking mechanisms 210, 220 are placed on a top surface 231 of the PCB above respective apertures 234, 236 through the PCB 230. The tiered locking mechanisms 210, 220 are secured to the PCB 230 using respective fastening mechanisms 215, 225, such as screws or anchoring mechanisms, that partially extend through respective apertures 234, 236 into the base of the respective tiered locking mechanisms 210, 220. For example, where the fastening mechanisms 215, 225 are screws, the screws extend through the respective apertures 234, 236 and engage with a threaded portion (not shown) of the tiered locking mechanisms 210, 220 where the fastening mechanisms 215, 225 are tightened with the PCB separating the head of the screw and the respective tiered locking mechanisms 210, 220.

Figure 3A:
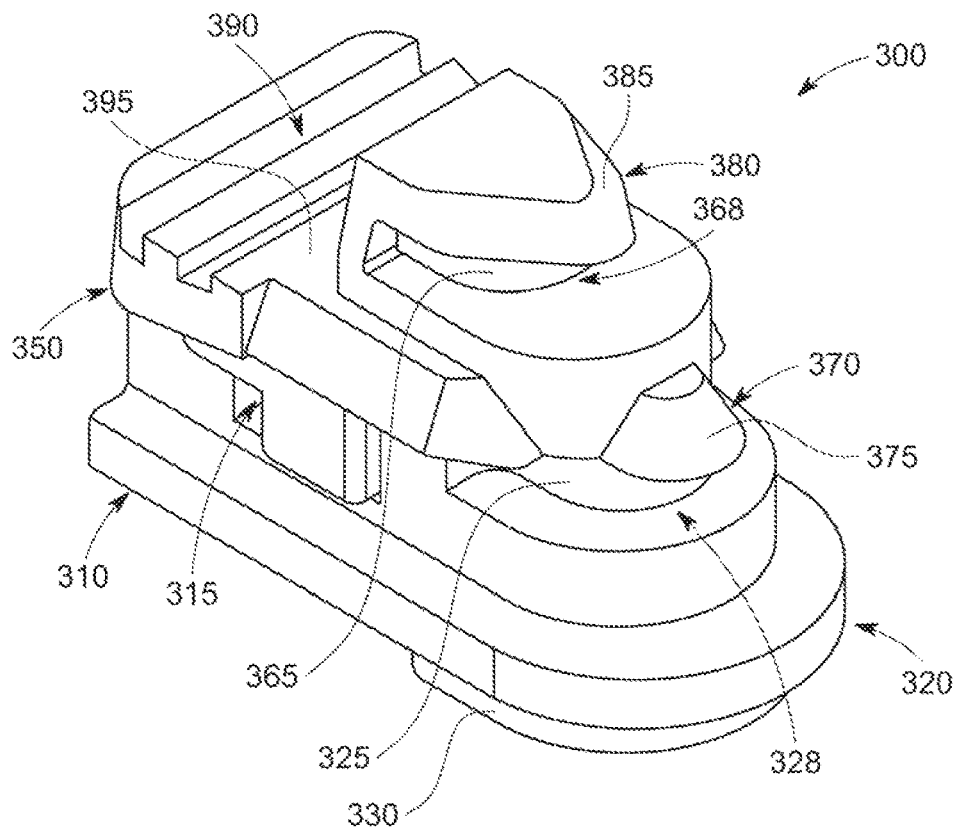
FIG. 3A depicts a right front isometric view of an exemplary tiered locking mechanism for securing both a low-position component card to a short connector and a high-position component card to a printed circuit board ("PCB") of a computing device, according to some implementations of the present disclosure.
Figure 3B:
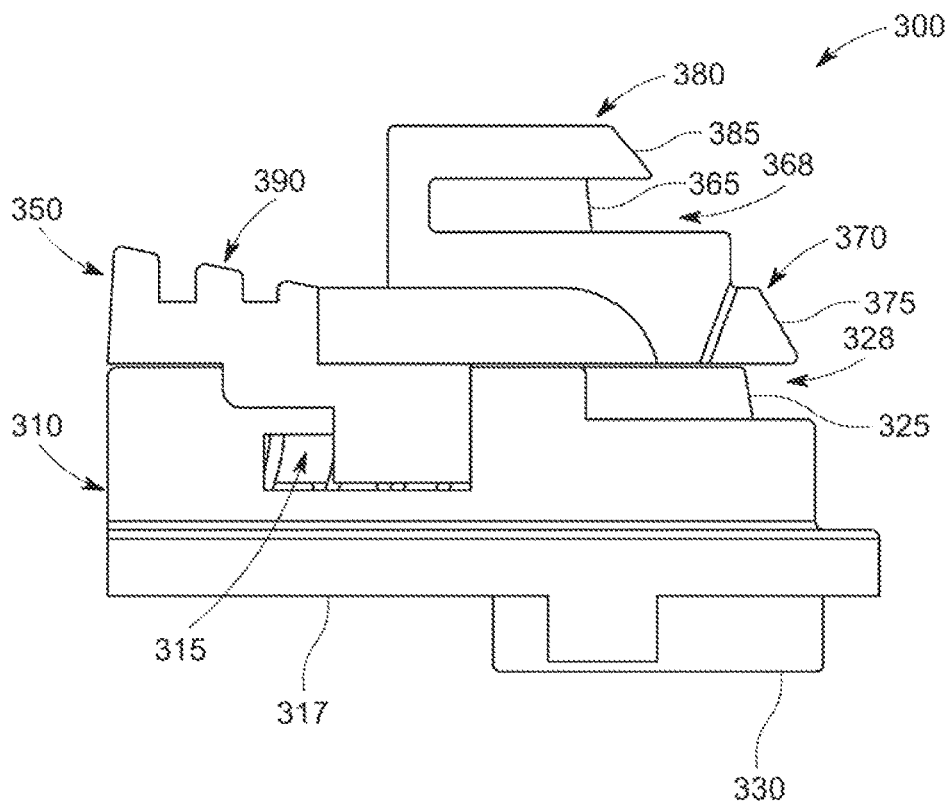
FIG. 3B depicts a side view of the exemplary tiered locking mechanism in FIG. 3A, according to some implementations of the present disclosure.
Figure 3C:
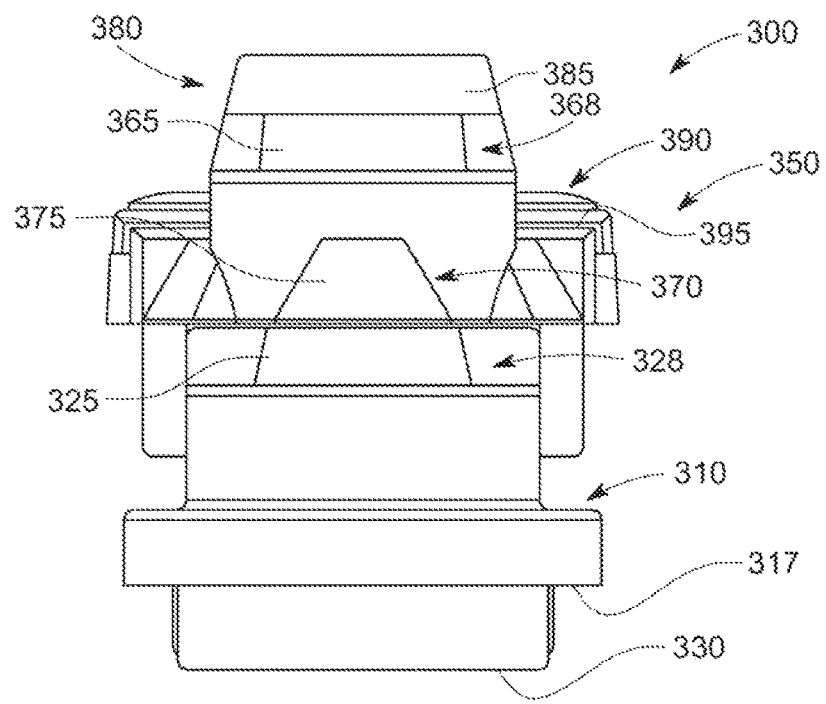
FIG. 3C depicts a front view of the exemplary tiered locking mechanism in FIG. 3A, according to some implementations of the present disclosure.

Turning to FIG. 3A to 3C, a right front isometric view, a side view, and a front view, respectively, are depicted of an exemplary tiered locking mechanism 300, similar to that depicted in FIGS. 1A to 1C and 2. The tier locking mechanism 300 accommodates the securing of either a low-position component card to a short connector and a high-position component card to a tall connector for a PCB (not shown) of a computing device. The tiered locking mechanism 300 includes a base 310 and a top slider structure 350 that is coupled to and disposed above the base 310. The top slider structure 350 can slide along the base 310, for example via a coupling to slot 315 or on tracks disposed on the base 310. The base 310 includes a first-tier side wall 325 at a component card engaging side 320 of the tiered locking mechanism 300. In some implementations, the base 310 includes a coupling structure 330 that extends downwardly from the bottom surface 317 (FIG. 3B) of the base 310 for engaging with and securing the tiered locking mechanism 300 to a top surface of a PCB (not shown).

The top slider structure 350 also includes a second-tier side wall 365 at the component card engaging side 320 of the tiered locking mechanism 300. The top slider structure 350 further includes a plurality of protrusions, such as exemplary lower protrusion 370 and upper protrusion 380, each having a respective beveled edge, such as beveled edges 375, 385. The top slider structure 350 is slidable between a locked position (toward the component card engaging side 320 or front of the tiered locking mechanism) and an unlocked position where the top slider structure 350 is slid relative to the base 310 away from the component card engaging side 320 (in the opposite direction of the locked position). In some implementations, the lower and upper protrusions 370, 380 of the top slider structure 350 are fully displaced in the unlocked position away from the component card engagement side 320, relative to the locked position depicted by tiered locking mechanism 300 in FIGS. 3A and 3B.

The lower protrusion 370 and the first-tier side wall 325 form a first receiving slot 328 when the top slider structure 350 is in the locked position with the top slider structure 350 fully displaced toward the component card engaging side 320 of the tiered locking mechanism 300. The upper protrusion 380 and the second-tier side wall 365 form a second receiving slot 368 disposed above the first receiving slot 328.

In some implementations, the top slider structure 350 may also include a tactile portion 390 that allows or aids a technician in sliding the top slider structure 350 from a locked position to an unlocked position. For example, a ribbed structure can be formed in a top surface 395 of the top slider structure 350. The ribbed structure can be located on the side opposite the component card engaging side 320, such as opposite either of the lower protrusion 370 or the upper protrusion 380.

Figure 3D:
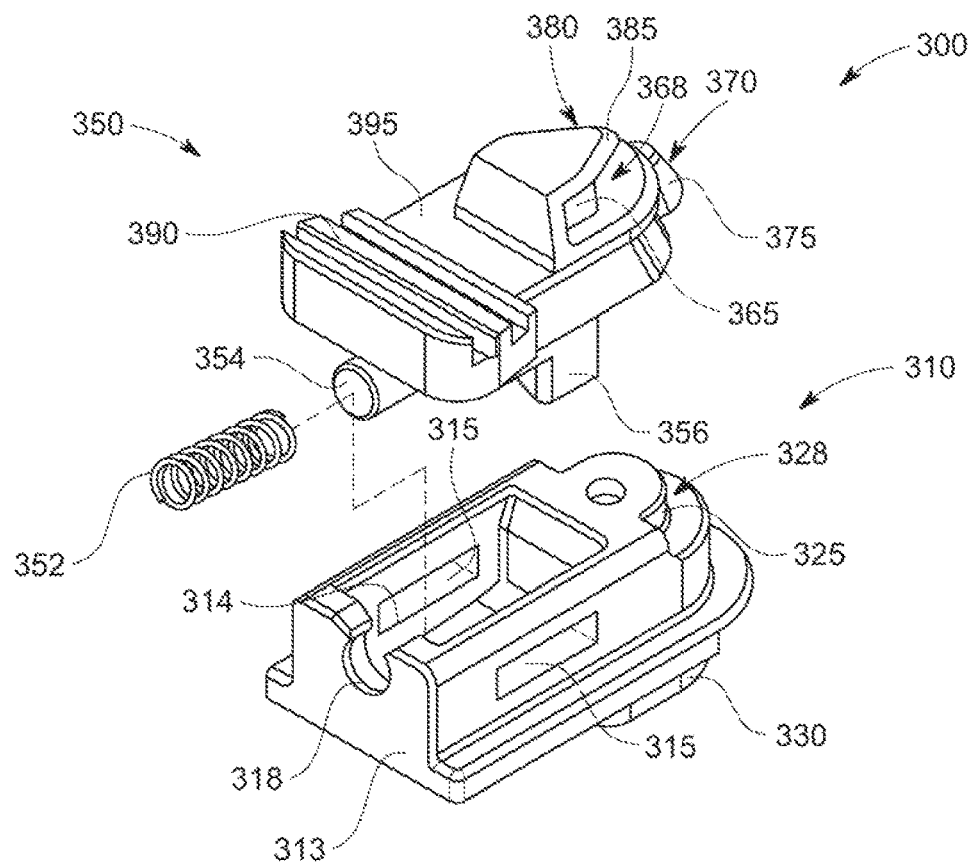
FIG. 3D depicts an exploded rear isometric view of the exemplary tiered locking mechanism in FIG. 3A, according to some implementations of the present disclosure.

Referring to FIG. 3D, an exploded rear isometric view is depicted of the exemplary tiered locking mechanism 300 depicted in FIGS. 3A to 3C. The tiered locking mechanism 300 has a base 310, a top slider structure 350, and a biasing element 352 located within an opening in the base 310. The top slider structure 350 can be slidably disposed on the base 310, and has a plurality of protrusions 370, 380 extending therefrom. The plurality of protrusions 370, 380 are tiered and depicted as an extension of the top slider structure 350 protruding out from the front side (i.e., component card engaging side). The top slider structure 350, along with the plurality of protrusions 370, 380, can include beveled edges 375, 385. In some implementations, only the plurality of protrusions 370, 380 include beveled edges.

The lower protrusion 370 and the first-tier side wall 325 form the first receiving slot 328 for a notch of a component card (not shown) engaging a short connector (not shown), as discussed in more detail for FIGS. 1A to 1C, 4, and 5A and 5B. The upper protrusion 380 and the second-tier side wall 365 form a second receiving slot 368 disposed above the first receiving slot 328. The second receiving slot 368 is also for a notch of a component card (not shown) coupled to a tall connector (not shown), as also discussed in more detail for FIGS. 1A to 1C, 4, and 5A and 5B. The base 310 can have a coupling portion 330 configured to secure the tiered locking mechanism 300 to a main board (not shown). This is discussed in greater detail with respect to FIGS. 4, 5A, and 5B.

The top slider structure 350 can be transitioned between a locked position and an unlocked position. The biasing element 352 disposed at least partially within an opening in the base 310 urges the tiered locking mechanism 300 into the locked position absent any counter forces greater than the urging forces of the biasing element. In the unlocked position following the application of a counter force to the force of the biasing element 352, the plurality of protrusions 370, 380 are displaced toward a back wall 313 of the base 310 relative to the locked position.

In some implementations, the tiered locking mechanism 300 can have a tactile portion 390 formed on the top slider structure 350 that may be disposed opposite one or more of the plurality of protrusions 370, 380. The tactile portion 390 can assist in transitioning the tiered locking mechanism 300 from the locked position and the unlocked position. For example, the tactile portion 390 can be operably engaged by a force (e.g., applied by a technician's finger) to guide the top slider structure 350 while simultaneously compressing the biasing element 352 located within the base 310 to transition the tiered locking mechanism 300 between the locked position and the unlocked position.

The beveled edge 375 of the lower protrusion 370 of the top slider structure 350 can also be configured to transition the tiered locking mechanism 300 to an unlocked position as a low-position component card (not shown) abuts against the beveled edge 375 immediately prior to being secured to a short connector (see element 117 in FIGS. 1A to 1C). The beveled edge 385 of the upper protrusion 380 of the top slider structure 350 can also be configured to transition the tiered locking mechanism 300 to an unlocked position as a high-position component card (not shown) abuts against the beveled edge 385 immediately prior to being secured to a tall connector (see element 127 in FIGS. 1A to 1C). A component card, whether being secured to a short connector or a high connector, abutting either of the beveled edges 375, 385 causes the component card to slide down the beveled edge 375 or 385. The contact of the component card with the beveled edge 375 or 385 of the lower protrusion 370 or upper protrusion 380 causes the top slider structure 350 to apply a force against the biasing element 352. The force then compresses the biasing element 352, and thus the tiered locking mechanism 300 transitions from the locked position to the unlocked position. The beveled edges 375, 385 can include a beveled portion, or sloped portion, disposed along the edges of their respective protrusions 370, 380.

The biasing element 352 located within an opening of the base 310 is configured to urge the top slider structure 350 toward a locked position. For example, a spring receiving opening 314 can be disposed within the base 310 to receive the biasing element 352. Compression of the biasing element 352 by sliding of the top slider structure 350 transitions the tiered locking mechanism 300 to an unlocked position.

In some implementations, a biasing element guide 354 extending from the top slider structure 350 is disposed within the base 310 and is configured to receive a biasing element 352. The biasing element 352 can include a spring, such as a coiled spring, coupled to the top slider structure 350. The biasing element guide 354 may be a protuberance extending opposite one of the plurality of protrusions, such as the lower protrusion 370, and is configured to receive the biasing element 352. In some implementations, the biasing element guide 354 may be a cylindrical structure around which the biasing element 352, such as spring, can be disposed. The biasing element guide 354 can allow smooth compression and expansion of the spring 352, while minimizing the spring 352 from compressing or deflecting in a direction inconsistent with transitioning of the locking mechanism 300 between the locked and unlocked position. The back wall 313 of the base 310 can include a rear aperture 318 for allowing the biasing element guide 354 to extend through as the top slider structure 350 is transitioned to the unlocked position.

The top slider structure 350 can include a tab structure 356 on corresponding sides of the top slider structure 350. The tab structure 356 can be received by slots 315 in the base 310 to allow the top slider structure 350 to transition between the locked position and the unlocked position. The tab structure 356 can slide from one end corresponding to the locked position to an opposite end corresponding to the unlocked position. The tab structure 356 is configured to guide the top slider structure 350 along the base 310. The tab structure 356 can slide within corresponding slots 315, or along a track (not shown), on both sides of the base 310.

Figure 4:
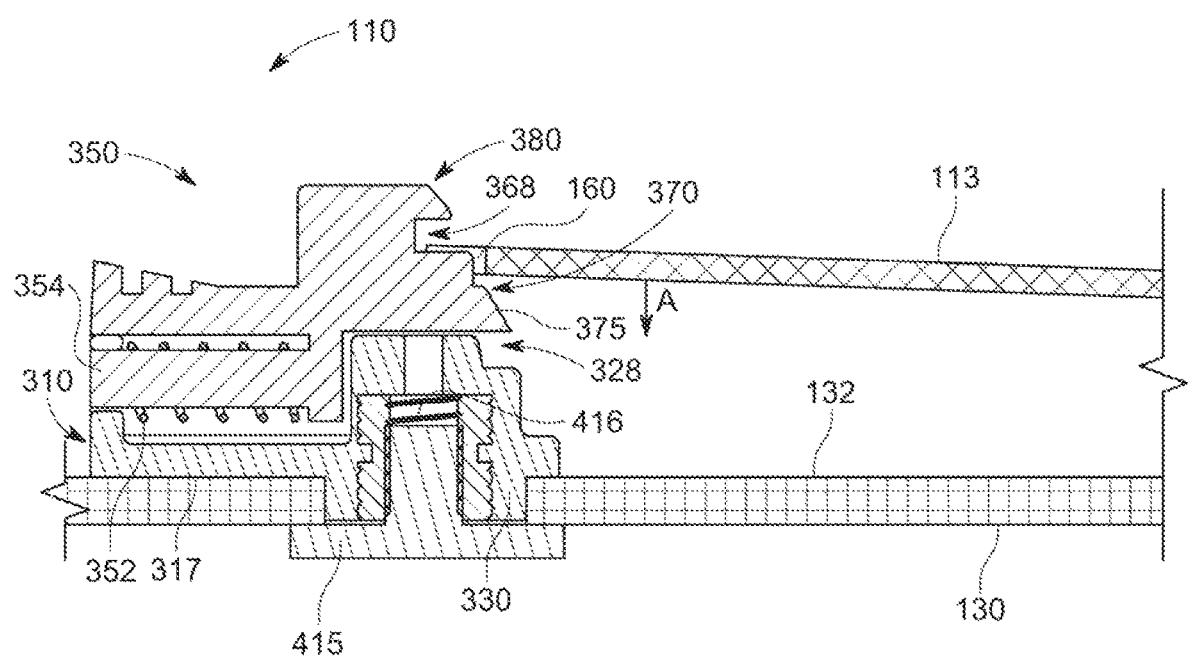
FIG. 4 is a cross-section through a portion of the exemplary PCB in FIG. 1A depicting immediately prior to the low-position component card being secured by in a first receiving slot of the tiered locking mechanism, according to some implementations of the present disclosure.

Turning to FIG. 4, a cross-section is depicted through a portion of the exemplary PCB 130 in FIG. 1A immediately prior to the low-position component card 113 being moved in direction A to secure the component card 113 in a first receiving slot 328 of the tiered locking mechanism 110. The tiered locking mechanism 110 is unique with the top slider structure 350 having tiered protrusions and receiving slots for receiving a component cards installed at varying heights on the PCB 130. For example, an upper protrusion 380 forms part of a second receiving slot 368 to secure a high-position component card (not shown) and further includes a lower protrusion 370 that forms a first receiving slot 328, together with the base 310, to secure a low-position component card 113 to the PCB 130.

The low-position component card 113 includes a notch 160 configured to be received in the first receiving slot 328 as the low-position component card 113 is moved in direction A after being coupled to a short connector (not shown) to the PCB. In some implementations, the notch 160 is a substantially semicircular. The notch 160 can engage with the beveled edge 375 of the lower protrusion 370 before being seated in the first receiving slot 328. As the notch 160 of the low-position component card 113 abuts the beveled edge 375, the top slider structure 350 is initially displaced to an unlocked position away from notch 160 toward the left side of FIG. 4 with the biasing element 352 compressing along the biasing element guide 354. Then, as the low-position component card 113 continues to be forced downward in direction A sliding along the beveled edge 375, the notch 160 clears the lower protrusion 370 and enters the first receiving slot 328. At this point, the top slider structure 350 is urged by the biasing element 352 toward the low-position component card 113 to a locked position where the low-position component card is secured by the tiered locking mechanism 110.

Figure 5A:
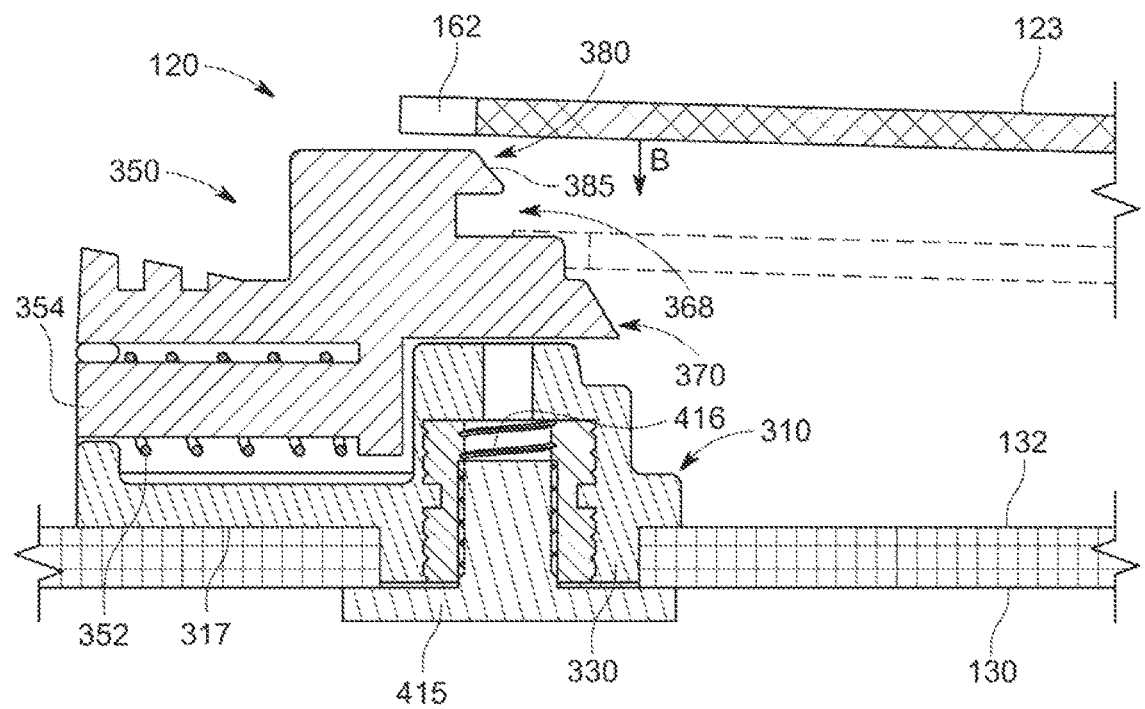
FIG. 5A is a cross-section through a portion of the exemplary PCB in FIG. 1A depicting immediately prior to the high-position component card being secured in a locked position in a second receiving slot of the tiered locking mechanism, according to some implementations of the present disclosure.

Turning now to FIG. 5A, a cross-section through a portion of the exemplary PCB 130 in FIG. 1A is depicted immediately prior to the high-position component card 123 being moved in direction B to be secured in a locked position in a second receiving slot 368 of the tiered locking mechanism 120. The tiered locking mechanism 120 is unique with the top slider structure 350 having an upper protrusion 380 that forms part of a second receiving slot 368 to secure a high-position component card 123, along with a low protrusion 370 that may allow the same tiered locking mechanism 120 to be used in other applications for securing a low-position component card, as discussed above for FIG. 4.

The high-position component card 123 includes a notch 162 configured to be received in the second receiving slot 368 when coupled to a tall connector (not shown) of the PCB 130. In some implementations, the notch 162 is a substantially semicircular. The notch 162 can engage with the beveled edge 385 of the upper protrusion 380 before being seated in the second receiving slot 368. As the notch 162 of the high-position component card 123 abuts the beveled edge 385 during continued movement in direction B, the top slider structure 350 is initially displaced to an unlocked position away from notch 162 toward the left side of FIG. 5A with the biasing element 352 compressing along the biasing element guide 354. Then, as the high-position component card 123 continues to be forced downward in direction B and along the beveled edge 385, the notch 162 clears the upper protrusion 380 and enters the second receiving slot 368. At this point, the top slider structure 350 is then urged by the biasing element 352 toward the high-position component card 123 to a locked position.

Figure 5B:
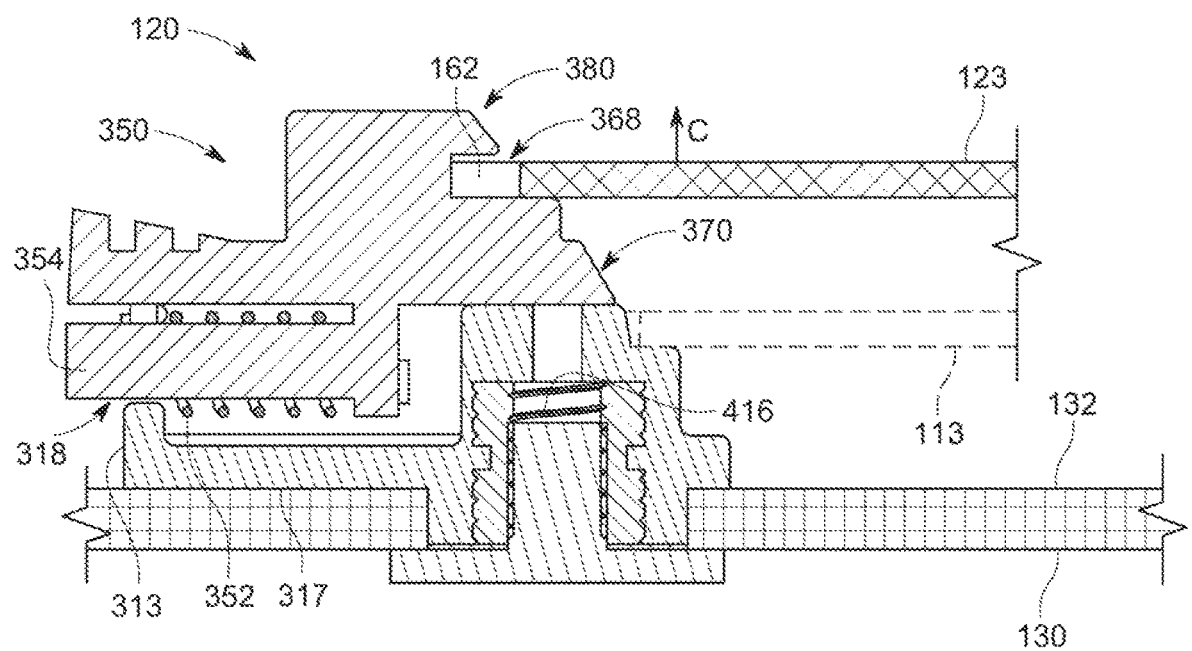
FIG. 5B is a cross-section through a portion of the exemplary PCB in FIG. 1A depicting the tiered locking mechanism in an unlocked position immediately prior to the high-position component card being removed, according to some implementations of the present disclosure.

FIG. 5B is a cross-section through a portion of the exemplary PCB 130 in FIG. 1A depicted immediately prior to the high-position component card 123 being removed, and with the tiered locking mechanism 120 in an unlocked position. The high-position component card 123 is depicted seated at least partially within the second receiving slot 368. The top slider structure 350 has been effectively displaced via an external force (e.g., a technical applying a force) applied to the top slider structure 350 to a fully unlocked position where the upper protrusion 380 is no longer disposed above the notch 162 of the seated high-position component card 123. This allows the high-position component card 123 to be lifted in direction C or otherwise rotated about the coupled tall connector (not shown) for the PCB and the high-position component card 123 removed. A similar process can be completed if a low-position component card 113 were secured by the tiered locking mechanism 120.

The biasing element 352 is depicted in a compressed position with the biasing element guide 354 extending through the rear aperture 318 of the back wall 313. A new component card, including a high-position card or a low-position component card, can then be installed due to the unique nature of the tiered locking mechanism 120 to accommodate component cards of varying installation heights on a PCB. The installation of the new component card can occur before the external force causing the compression of the biasing element 352 is removed. Once the external force is removed, the top slider structure 350, including the lower and upper protrusions 370, 380, is urged by the biasing element 352 back to the locked position.

Referring back to FIG. 4, along with FIGS. 5A, and 5B, the depicted cross-sections also include the coupling structure 330. While the coupling structure 330 in some implementations may encapsulate the full length (not shown) of the base 310 of the tiered locking mechanisms 110, 120, the coupling structure 330 is depicted as a downward extension of the base 310. It is contemplated that the coupling structure 330 does not extend significantly from the bottom surface 317 (see FIG. 5A) of the base 310. In the depicted implementations, the coupling structure 330 and the base 310 are formed as a unibody structure, though other configurations are contemplated. The coupling structure 330 can have a securing element 415 configured to be disposed through an aperture formed in the PCB 130 as discussed above for FIG. 2. The securing element 415 and the aperture 416 can have corresponding circumferences, where the aperture 416 is slightly larger, to allow for a substantially corresponding fit between the two parts. For example, the coupling structure 330 of the tiered locking mechanism 300 can include a threaded aperture and the at least one securing element 415 can be a screw coupled to the threaded aperture. In some implementations, the securing element 415 and the aperture 416 can have an interference fit, where the condition of fit or contact between the two parts requires pressure to force or otherwise fit the parts together.

Further referring to FIGS. 4, 5A and 5B, it is contemplated that the bottom surface 317 of the base can be configured in some implementations to abut and engage a top surface 132 of the PCB 130, along with the coupling structure 330 being disposed through aperture (see elements 236, 234 in FIG. 2) formed in the PCB 130. By securing the tiered locking mechanism 110, 120 to the PCB 130, the coupling structure 330 allows a component card (e.g., low-position component card 113, high-position component card 123) to be received and secured by the tiered locking mechanism 110, 120.

The illustrated aspects described above, including in FIGS. 1 to 5B, are primarily in the context of component cards being inserted and removed from a PCB of a computing device. However, the described locking mechanism is applicable to other component card arrangements of varying heights above a surface of a PCB. The described tiered locking mechanisms for component cards to tall and short connectors for a PCB have been presented by way of example only, and not limitation, and can include different combinations of the described elements.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A tiered locking mechanism configured to secure a component card in one of two different positions on a same side of a printed circuit board (PCB), the tiered locking mechanism comprising:
    a base including a first-tier side wall at a component card engagement side of the tiered locking mechanism and a coupling structure configured to engage the PCB;
    a top slider structure coupled to and disposed above the base, the top slider structure including a second-tier side wall at the component card engagement side and a plurality of protrusions each having a beveled edge, the top slider structure being slidable between a locked position and an unlocked position, the unlocked position including the plurality of protrusions being displaced away from the component card engagement side relative to the locked position, a bottom one of the plurality of protrusions and the first-tier side wall forming a first receiving slot in the locked position, a top one of the plurality of protrusions and the second-tier wall forming a second receiving slot; and
    a biasing element disposed between the base and the top slider structure, the biasing element configured to urge the top slider structure toward the locked position and to compress as the top slider structure is displaced away from the component card engagement side to an unlocked position.

2. The tiered locking mechanism of claim 1, further comprising a ribbed portion of a top surface of the top slider structure opposite the plurality of protrusions, the ribbed portion configured to assist moving the top slider structure from the locked position to the unlocked position.

3. The tiered locking mechanism of claim 1, wherein the coupling structure comprises at least one securing element configured to be disposed through an aperture formed in the PCB.

4. The tiered locking mechanism of claim 3, wherein the coupling structure includes a threaded aperture, the at least one securing element being a screw coupled to the threaded aperture.

5. The tiered locking mechanism of claim 3, wherein the coupling structure is configured to form a pressure fit with the aperture.

6. The tiered locking mechanism of claim 1, wherein the biasing element is a coiled spring.

7. The tiered locking mechanism of claim 6, wherein the top slider structure includes a spring guide with the spring disposed about the spring guide, the base including a biasing element receiving portion with the spring and spring guide disposed therein.

8. The tiered locking mechanism of claim 7, wherein the spring is coupled to the base and the top slider structure.

9. The tiered locking mechanism of claim 1, wherein an aperture is formed in an end of the base opposite the component card engagement side, the aperture configured to allow at least a portion of the spring guide to pass through.

10. The tiered locking mechanism of claim 1, wherein the component card is an M.2 card having a notch configured to be received in the first receiving slot when coupled to a short connector to the PCB and in the second receiving slot when coupled to a tall connector to the PCB.

11. The tiered locking mechanism of claim 10, wherein the notch is a substantially semicircular.

12. The tiered locking mechanism of claim 10, wherein the notch engages with the beveled edge of the top one of the plurality of protrusions before being seated in the second receiving slot, the top slider structure configured to initially be displaced away from the component card engaging end followed by being displaced toward the component card engaging end to the locked position.

13. The tiered locking mechanism of claim 10, wherein the notch engages with the beveled edge of the bottom one of the plurality of protrusions before being seated in the first receiving slot, the bottom slider structure configured to initially be displaced away from the component card engaging end followed by being displaced toward the component card engaging end to the locked position.

14. A component board comprising:
    a printed circuit board; and
    at least one tiered locking mechanism configured to secure a component card in one of two different positions on a same side of the printed circuit board, the at least one tiered locking mechanism including:
        a base including a first-tier side wall at a component card engagement side of the at least one tiered locking mechanism and a coupling structure configured to engage the printed circuit board;
        a top slider structure coupled to and disposed above the base, the top slider structure including a second-tier side wall at the component card engagement side and a plurality of protrusions each having a beveled edge, the top slider structure being slidable between a locked position and an unlocked position, the unlocked position including the plurality of protrusions being displaced away from the component card engagement side relative to the locked position, a bottom one of the plurality of protrusions and the first-tier side wall forming a first receiving slot in the locked position, a top one of the plurality of protrusions and the second-tier wall forming a second receiving slot; and
        a biasing element disposed between the base and the top slider structure, the biasing element configured to urge the top slider structure toward the locked position and to compress as the top slider structure is displaced away from the component card engagement side to an unlocked position.

15. The component board of claim 14, wherein the coupling structure includes at least one securing element configured to be disposed through an aperture formed in the PCB.

16. The component board of claim 15, wherein the coupling structure is configured to form a pressure fit with the aperture.

17. The component board of claim 14, wherein the biasing element is a spring, the top slider structure includes a spring guide with the spring disposed about the spring guide, the base including a biasing element receiving portion with the spring and spring guide disposed within at least a portion of the biasing element receiving portion, the spring being coupled to the base and the top slider structure.

18. The component board of claim 14, wherein the component card is an M.2 card having a notch configured to be received in the first receiving slot when coupled to a short connector to the PCB and to be received in the second receiving slot when coupled to a tall connector to the PCB.

19. The component board of claim 14, wherein the notch engages with the beveled edge of the top one of the plurality of protrusions before being seated in the second receiving slot, the top slider structure configured to initially be displaced away from the component card engaging end followed by being displaced toward the component card engaging end to the locked position.

20. The component board of claim 14, wherein the notch engages with the beveled edge of the bottom one of the plurality of protrusions before being seated in the first receiving slot, the bottom slider structure configured to initially be displaced away from the component card engaging end followed by being displaced toward the component card engaging end to the locked position.

* * * * *